United States Patent
Itoh et al.

(10) Patent No.: US 7,473,972 B2
(45) Date of Patent: Jan. 6, 2009

(54) THIN FILM TRANSISTOR SUBSTRATE AND METHOD FOR MANUFACTURING THE SAME

(75) Inventors: Yasuyoshi Itoh, Tokyo (JP); Atsunori Nishiura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 14 days.

(21) Appl. No.: 11/765,103

(22) Filed: Jun. 19, 2007

(65) Prior Publication Data

US 2008/0017865 A1    Jan. 24, 2008

(30) Foreign Application Priority Data

Jul. 20, 2006    (JP) .............................. 2006-198510

(51) Int. Cl.
  *H01L 29/417* (2006.01)
(52) U.S. Cl. ............................ 257/351; 257/72; 257/66; 257/E29.117; 438/154; 438/151; 438/163
(58) Field of Classification Search ................... 257/66, 257/72, 351, E29.117; 438/151, 154, 163
See application file for complete search history.

(56) References Cited

U.S. PATENT DOCUMENTS

| | | | | |
|---|---|---|---|---|
| 6,933,526 B2 * | 8/2005 | So | ............................... | 257/59 |
| 7,151,015 B2 * | 12/2006 | Suzawa et al. | ............... | 438/149 |
| 7,161,177 B2 * | 1/2007 | Suzawa et al. | ................. | 257/59 |
| 7,211,475 B2 * | 5/2007 | So | ............................... | 438/154 |
| 2003/0160245 A1 | 8/2003 | Kurosawa | | |

FOREIGN PATENT DOCUMENTS

| | | |
|---|---|---|
| JP | 7-326763 | 12/1995 |
| JP | 2000-77665 | 3/2000 |
| JP | 2000-332254 | 11/2000 |
| JP | 2003-258262 | 9/2003 |

* cited by examiner

*Primary Examiner*—Victor A Mandala
(74) *Attorney, Agent, or Firm*—Oblon, Spivak, McClelland, Maier & Neustadt, P.C.

(57) ABSTRACT

A thin film transistor substrate includes a thin film transistor of a first conductivity type, a semiconductor layer having a channel region of the first conductivity type placed between the source/drain regions, a gate electrode formed to an opposite face to the semiconductor layer with an gate insulating film interposed therebetween, an opening in the gate electrode corresponding to both edges in a channel width direction of the channel region. In the channel region corresponding to the opening, a highly concentrated impurity region having a higher impurity concentration of the first conductivity type than the channel corresponding to the gate electrode is formed.

5 Claims, 11 Drawing Sheets

RELATED ART

Fig. 9

RELATED ART

Fig. 10A

RELATED ART

Fig. 10B

RELATED ART

Fig. 11

THIN FILM TRANSISTOR SUBSTRATE AND METHOD FOR MANUFACTURING THE SAME

BACKGROUND OF THE INVENTION

1. Field of the Invention

The present invention relates to a thin film transistor substrate and a method for manufacturing the same.

2. Description of Related Art

In a display device using liquid crystal or organic EL, a large number of pixels are arranged in matrix. A Thin Film Transistor (hereinafter referred to as TFT) is used as a switching device for each of the pixels. The TFT is connected with a pixel electrode, a scan signal line and an image signal line for driving the liquid crystal.

A conventional TFT has mainly been using amorphous silicon (hereinafter referred to as a-Si) film as a material for semiconductor layer. However in recent years, TFTs using poly crystalline silicon (hereinafter referred to as p-Si) film as a material for semiconductor layer are planed to be in practice. This is because that the TFT using p-Si as semiconductor layer has high mobility and favorable semiconductor characteristic. Accordingly not only for a switching device, but such TFT can be used as a drive circuit device for driving the switching device. By forming a drive circuit over an array substrate, there are favorable advantages such that an IC (Integrated Circuit) for driving is not required to be installed. Thus it is expected to reduce the cost, improve functionalities and achieve advanced integration.

Figure 9:
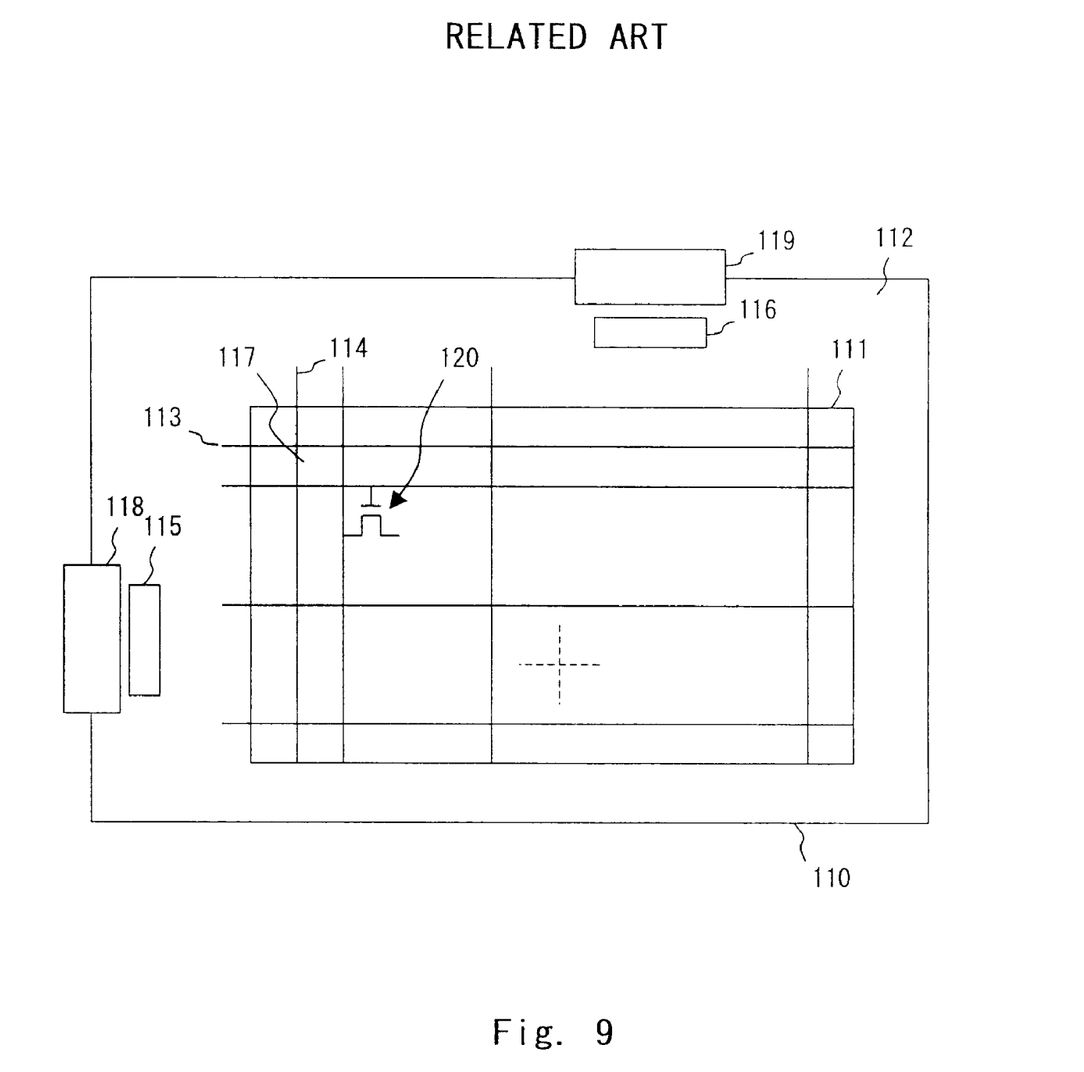
FIG. 9 is a view showing the configuration of an array substrate of a liquid crystal display.

For a liquid crystal display, an array substrate 110 is formed by forming TFTs, signal lines and pixel electrodes in a desired position and configuration over an insulating substrate as shown in FIG. 9.

A display region 111 and a frame region 112 surrounding the display region 111 are provided on the array substrate 110. In the display region 111, a plurality of gate lines (scanning signal lines) 113 and a plurality of source lines (display signal lines) 114 are formed. The plurality of gate lines 113 are provided in parallel. Likewise, the plurality of source lines 114 are provided in parallel. The gate lines 113 and the source lines 114 are formed to cross each other. The gate lines 113 and the source lines 114 are orthogonal to each other. Further, a region surrounded by adjacent gate lines 113 and the source lines 114 is a pixel 117. Accordingly the pixels 117 are arranged in matrix in the array substrate 110.

Further, in the frame region 112 of the array substrate 110, a scanning signal drive circuit 115 and a display signal drive circuit 116 are formed. The gate lines 113 extend from the display region 111 to the frame region 112. Further, the gate lines 113 are connected with the scanning signal drive circuit 115 at the edge of the array substrate 110. Likewise, the source lines 114 extend from the display region 111 to the frame region 112. Further, the source lines 114 are connected with the display signal drive circuit 116 at the edge of the array substrate 110. An external line 118 is connected near the scanning signal drive circuit 115 via the terminal connecting portion. Further, an external line 119 is connected near the display signal drive circuit 116 via the terminal portion. The external lines 118 and 119 constitute wiring board such as FPC (Flexible Printed Circuit).

Various signals are externally supplied through the external lines 118 and 119 to the scanning signal drive circuit 115 and the display signal drive circuit 116, respectively. In accordance with an external control signal, the scanning signal drive circuit 115 supplies a gate signal (scanning signal) to the gate line 113. In response to the gate signal, the gate lines 113 are selected one by one. The display signal drive circuit 116 supplies a display signal (an applied voltage) to the source line 114 based on an external control signal and display data. Thus, an applied voltage corresponding to the display data can be supplied to each pixel 117.

At least one TFT 120 is formed in the pixel 117. The TFT 120 is placed near the crossing point of the source line 114 and gate line 113. The TFT 120 provides an applied voltage to a pixel electrode, for example. Specifically, in response to the gate signal from the gate line 113, the TFT 120, a switching device, is turned on. Thus, the applied voltage is supplied to the pixel electrode connected to a drain electrode of the TFT 120 from the source line 114. Further, an electric field depending on the applied voltage is generated between the pixel and opposing electrodes. Incidentally, an alignment layer (not shown) is formed over the surface of the array substrate 110.

Further, an opposing substrate is placed opposed to the array substrate 110. The opposing substrate may be a color filter substrate, which is placed on the viewing side. A color filter, a black matrix (BM), an opposing electrode, an alignment layer and so on are formed over the opposing substrate. For IPS (In-Plane Switching) or the like, the opposing electrode may be placed on the array substrate 110 side. Furthermore, a liquid crystal layer is held between the array substrate 110 and the opposing substrate. Specifically, liquid crystal is filled between the array substrate 110 and the opposing substrate. Moreover, a polarizing plate and a retardation film or the like are provided to the outside surface of the array substrate 110 and the opposing substrate. Further a backlight unit or the like is provided to a non-visible side of the liquid crystal display panel.

Liquid crystal is driven by the electric field between the pixel and opposing electrodes. Specifically, an alignment direction of the liquid crystal between the substrates varies. That is, the light passed through the polarization plate to become a linear polarization changes its polarization state by the liquid crystal layer. To be more specific, in the transparent region, the light from the backlight becomes a linear polarization by the polarization plate provided to the TFT array substrate side. Then the polarization state of the linearly polarized light changes by passing through the liquid crystal layer.

The amount of light passing through the polarizing plate on the opposing substrate varies according to the polarization state. Specifically, among the transmitted light transmitting the liquid crystal display panel from the backlight unit, the amount of light passing through the polarizing plate on the visible side changes. The alignment direction of the liquid crystal varies according to the applied voltage. Accordingly by controlling the applied voltage, the amount of light passing through the polarizing plate on the visible side can be changed. That is, by varying the applied voltage for each pixel, a desired image can be displayed.

Figure 10A:
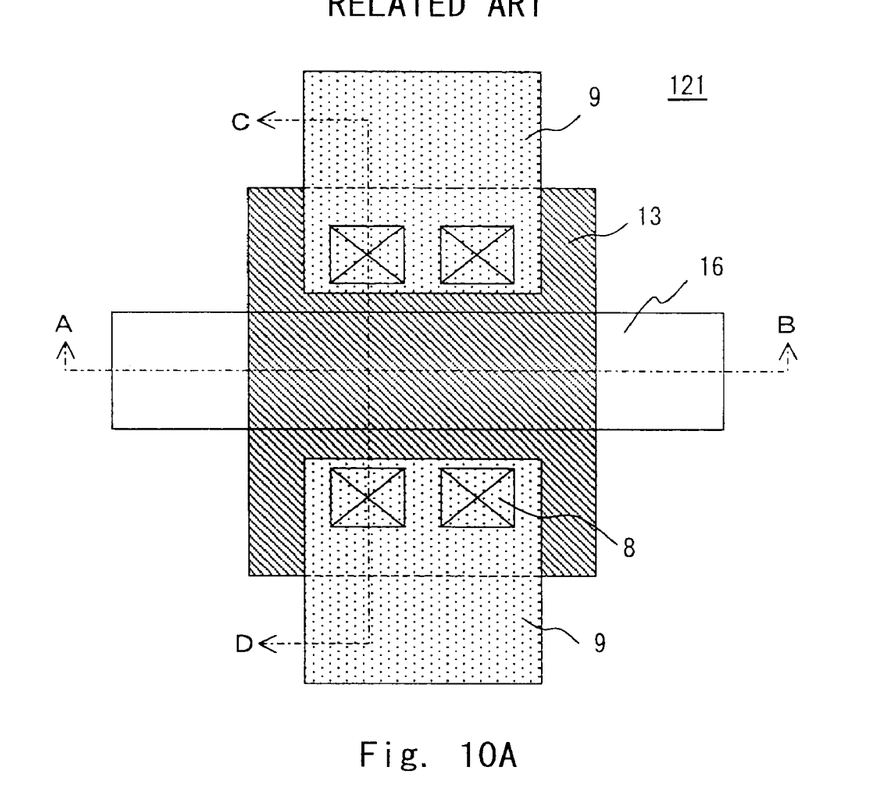
FIG. 10A is a plane view showing a TFT according to a conventional technique.
Figure 10B:
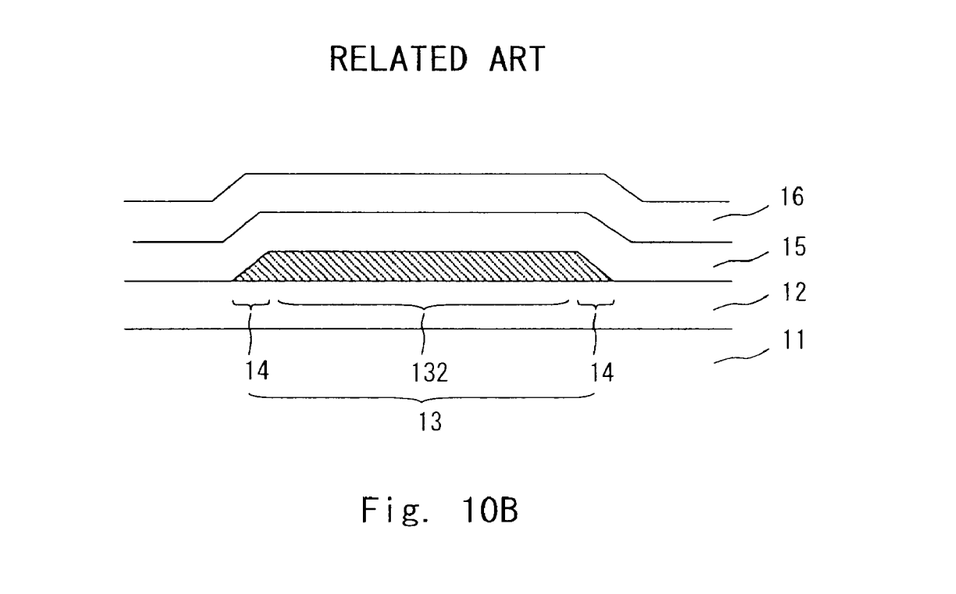
FIG. 10B is a cross-sectional view showing the TFT according to a conventional technique.

FIGS. 10A and 10B are a plane view and a cross-sectional view showing the configuration of a general top gate type p-Si TFT, respectively. FIG. 10B is a cross-sectional view taken along the line A-B of FIG. 10A. Note that the cross-sectional view of the line C-D of FIG. 10A is same as FIG. 1C.

A TFT 121 is comprised of a semiconductor layer 13 formed on an insulating protective layer 12, over an insulating substrate 11, a gate insulating film 15 formed over the semiconductor layer 13, and a gate electrode 16 formed over the gate insulating film 15. For a bottom-gate a-Si TFT, the positions of the gate electrode 16 and the semiconductor layer 13 are interchanged each other.

In FIG. 10B, the cross-section surface of the semiconductor layer 13 is in trapezoid shape in which the width gets narrowed from the bottom to the top, with its side being tapered shape (a tapered portion 14). The reason for this is described hereinafter. As shown in FIG. 10B, the gate insulating film 15 is formed to cover the semiconductor layer 13. If the cross-sectional shape of the semiconductor layer 13 is rectangle, the gate insulating film 15 has a bad coverage at the side of the semiconductor layer 13, overhanging to form a shade. After that, to dry etch the gate electrode layer to form the gate electrode 16, the gate electrode material deposited under the shade remains as an etching residue. The etching residue causes a problem of shorting-out with adjacent line. Further, if the gate electrode layer is wet etched, there is a problem in that the gate electrode material covering the shade is also etched and the gate electrode 16 is disconnected. To solve such problem, the side of the semiconductor layer 13 is formed in tapered shape.

Figure 11:
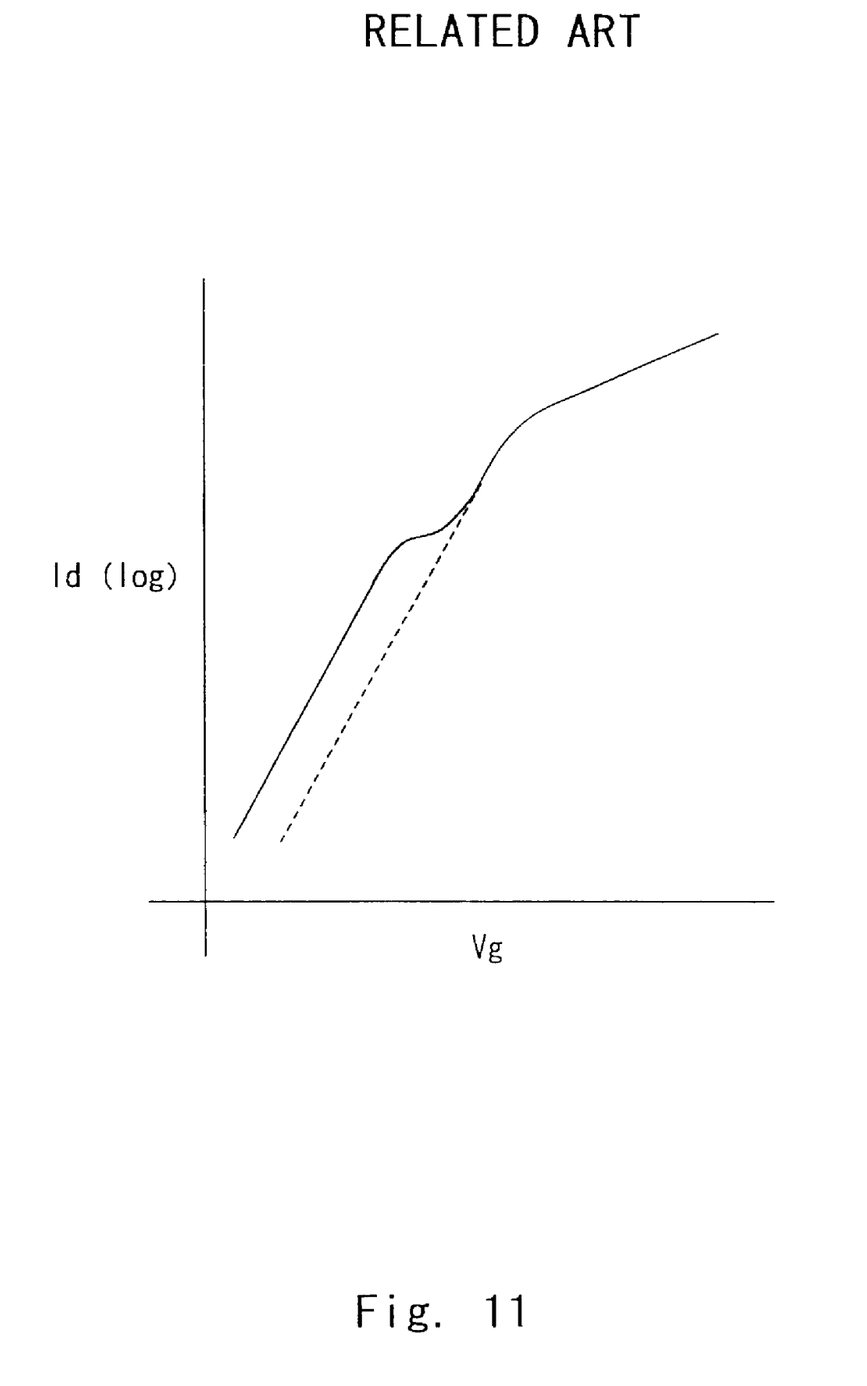
FIG. 11 is a graph illustrating a subthreshold characteristic of a TFT.

By forming the side of the semiconductor layer 13 in tapered shape, problems relating to the etching residue and disconnection of the gate electrode 16 can be resolved. However there is another problem generated. That is, by a thin portion (the tapered portion 14) in the film thickness of the semiconductor layer 13, the TFT 121 is turned on at a lower gate voltage than the channel region 132, the main portion of the semiconductor layer 13. Therefore in subthreshold characteristic (Id-Vg characteristic) shown in FIG. 11, there is a problem that a hump is likely to be generated. This makes it difficult to control a threshold voltage (Vth), thereby causing to destabilize the device characteristic of the TFT 121.

To solve such problems, techniques are disclosed in Japanese Unexamined Patent Application Publication No. 2000-77665, Japanese Unexamined Patent Application Publication No. 2003-258262, Japanese Unexamined Patent Application Publication No. 2000-332254 and Japanese Unexamined Patent Application Publication No. 7-326763. In Japanese Unexamined Patent Application Publication No. 2000-77665, Japanese Unexamined Patent Application Publication No. 2003-258262, and Japanese Unexamined Patent Application Publication No. 2000-332254, impurity such as Ar is doped in the tapered portion 14 or the tapered portion 14 is oxidized in order to improve the electric characteristic of the TFT 121. By substantially increasing the electric resistance of the tapered portion 14, the TFT is prevented from turning on in a comparatively low gate voltage. In the technique disclosed in Japanese Unexamined Patent Application Publication No. 7-326763, openings are created in a part of the gate electrode 16 over the tapered portion 14 of the semiconductor layer 13, and an impurity is prevented from introducing in the tapered portion 14. That is, the gate electrode 16 does not exist above the tapered portion 14 and no impurity exist in the tapered region 14. Consequently the tapered portion 14 is unlikely to be influenced by the potential of the gate electrode 16.

However the inventors have found that there is a following problem in the conventional techniques. In the techniques disclosed in Japanese Unexamined Patent Application Publication No. 2000-77665, Japanese Unexamined Patent Application Publication No. 2003-258262 and Japanese Unexamined Patent Application Publication No. 2000-332254, to introduce an impurity in the tapered portion 14 or to oxidize, a new process must be added. Further in the technique disclosed in Japanese Unexamined Patent Application Publication No. 7-326763, if a fixed potential exists in the insulating film or the interface of the insulating film near the tapered portion 14, an inversion layer is likely to be formed due to the fixed potential. Specifically, the technique has improvement effects however there still is a possibility of a problem for generating the hump in the subthreshold characteristic shown in FIG. 11.

SUMMARY OF THE INVENTION

An object of the present invention is to provide a thin film transistor substrate having excellent characteristics and a method for manufacturing the same in light of the foregoing problems.

According to a first aspect of the present invention, there is provided a thin film transistor substrate that includes a thin film transistor of a first channel conductivity type and a thin film transistor of a second channel conductivity type. In the thin film transistors, an opening is provided in gate electrodes opposed to a channel region with a gate insulating film interposed therebetween, the opening is formed in at least a part of the gate electrode over tapered portions in an edge of the channel regions, an impurity region of a same type as a source/drain region of the thin film transistor of the second channel conductivity type is formed in a channel region corresponding to the opening in the thin film transistor of the first channel type, and an impurity region of a same type as a source/drain region of the thin film transistor of the first channel conductivity type is formed in a channel region corresponding to the opening in the thin film transistor of the second channel type.

The thin film transistor substrate characterized in that the opening is opened to a source region side or a drain region side of the thin film transistors.

Further the opening of the thin film transistor substrate is opened from the source region side to the drain region side of the thin film transistor in a planar manner.

Furthermore, the gate electrode of the thin film transistor substrate opposed to the channel region with the gate insulating film interposed therebetween is electrically connected by a wiring layer formed in an upper layer than the gate electrode.

According to a second aspect of the present invention, there is provided a method for manufacturing a thin film transistor substrate comprising a thin film transistor of a first channel conductivity type and a thin film transistor of a second channel conductivity type. The method includes performing an impurity doping for forming a source/drain region in the thin film transistor of the first channel conductivity type in a same process as an impurity doping for a channel region corresponding to an opening provided in the gate electrode of the thin film transistor of the second channel conductivity type, and performing an impurity doping for forming a source/drain region in the thin film transistor of the second channel conductivity type in a same process as an impurity doping for a channel region corresponding to an opening provided in the gate electrode of the thin film transistor of the first channel conductivity type.

With the abovementioned configuration, the present invention provides a thin film transistor substrate having excellent characteristics and a manufacturing method as the generation of the hump can be suppressed in the subthreshold characteristic (Id-Vg characteristic) and also the control of the threshold voltage (Vth) can be improved without adding a new process.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The invention will be now described herein with reference to illustrative embodiments. Certain figures may be shown in generalized form in the interest of clarity and conciseness. Further the description is simplified and will not be repeated as appropriate.

First Embodiment

Figure 1A:
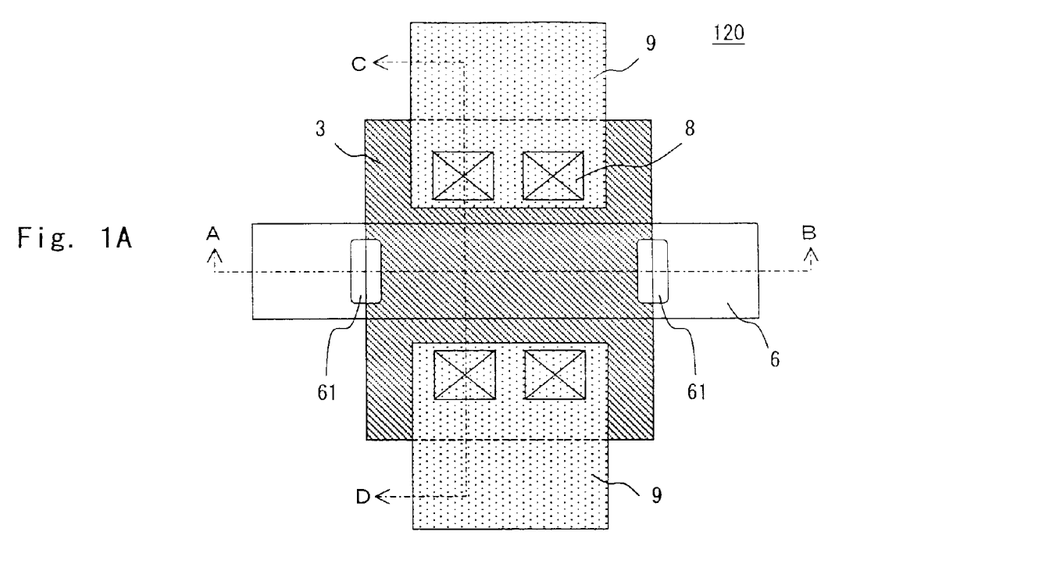
FIG. 1A is a plane view showing a TFT according to a first embodiment of the present invention.
Figure 1B:
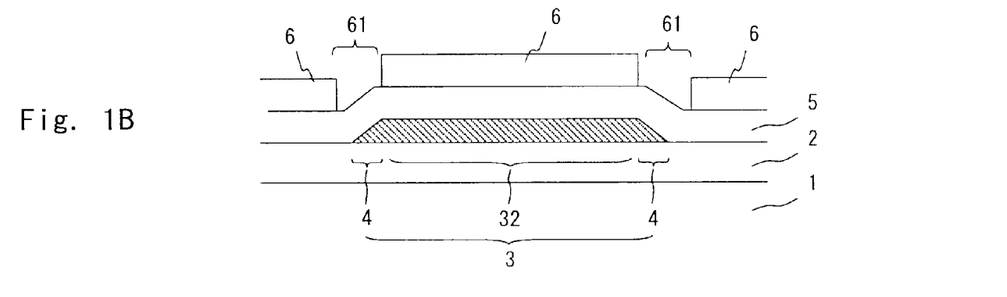
FIGS. 1B and 1C are cross-sectional view showing the TFT according to the first embodiment of the present invention.
Figure 1C:
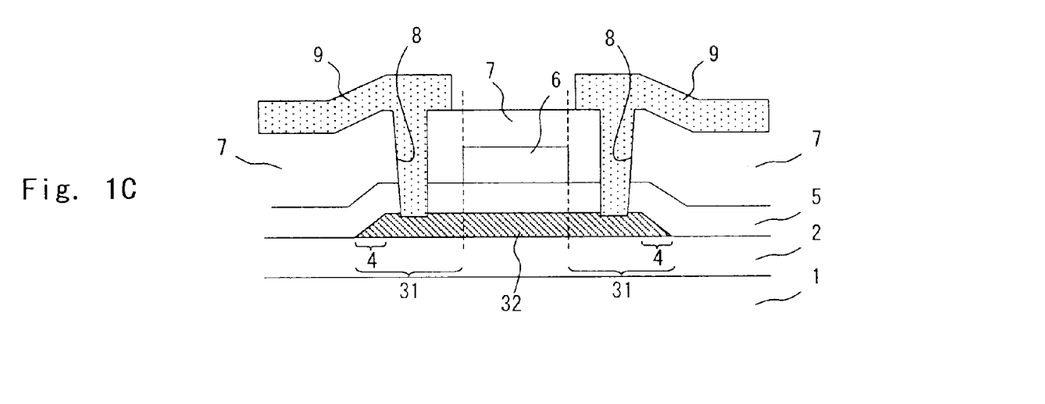

FIGS. 1A to 1C are a typical TFT according to the present invention. FIG. 1A is a plane view showing a planar structure of the TFT. FIG. 1B is a cross-sectional view taken along the line A-B in FIG. 1A. FIG. 1C is a cross-sectional view taken along the line C-D in FIG. 1A. The structure of the TFT is described hereinafter in detail with reference to FIGS. 1A to 1C. Note that FIGS. 1A to 1C show either one of thin film transistors of NMOS or PMOS among CMOS transistors formed in the scanning signal drive circuit 115 or the display signal drive circuit 116 shown in FIG. 9. The structure of the array substrate is identical to the one shown in FIG. 9.

In the TFT of FIGS. 1A to 1C, the insulating protective layer 2 is deposited over the insulating substrate 1. Next, the semiconductor layer 3 having a source/drain region 31 and a channel region 32 is deposited, and after a photolithography process, the semiconductor layer 3 is processed in a desired pattern. In an actual device, the planar shape of the semiconductor layer 3 may be various shape depending on a channel length and width of the transistor and position of the contact. In FIGS. 1A to 1C, the shape is shown in a simple rectangle for convenience (see FIG. 1A) Further, as described in the foregoing, the edge of the semiconductor layer 3 is tapered shape (tapered portion 4) in order to secure withstand voltage between the gate electrode 6 and semiconductor layer 3 (preventing short-out) and to prevent a disconnection of the gate electrode 6.

Next, the gate insulating film 5 and gate electrode 6 are sequentially formed. After a photolithography process, the gate electrode 6 is processed in a desired pattern. The first embodiment is characterized by that an opening 61 is provided to the gate electrode 6 that corresponds to the upper part of the tapered portion 4 of the semiconductor layer 3.

The opening 61 has almost same width as the tapered portion 4, opening in a rectangle shape along with the channel length direction of the gate electrode 6. The opening 61 may have enough width to include the tapered portion 4, in light of size shifting by a photolithography process, an etching process and an alignment accuracy of the photolithography process.

The shape of the opening 61 is not limited to a rectangle but may be an oval shape. The gate electrode 6 above the tapered portion 4 is not completely separated, with its both edges are connected in the channel width direction. In the channel width direction, the gate electrode 6 is formed wider than the tapered portion 4, with its sides coming out of the tapered portion 4. As set forth above, at least a part of the gate electrode 6 is opened, where the gate electrode 6 corresponds to an opposite face of an edge in the channel width direction of the channel region 32 of the semiconductor layer 3. Note that in the present invention, the edge in the channel width direction of the channel region 32 is same meaning as the tapered portion 4 in the channel region 32. Further the gate insulating film 5 is placed between the gate electrode 6 and the semiconductor layer 3. The gate electrode 6 exists on the gate insulating film 5 over the channel region 32 of the semiconductor layer 3 excluding the tapered region 4.

On the other hand in FIG. 1C, after doping impurity in the source/drain region 31 of the semiconductor layer 3, the interlayer insulating film 7 is deposited. Next, after a photolithography, an etching and a resist removing processes, contact holes 8 are created in the interlayer insulating film 7 and the gate insulating film 5 above the source/drain region 31. After that, following the deposition, photolithography, etching and resist removing processes for the wiring material, source lines 9 are formed to form a desired circuit. Then the formation of the TFT is completed.

To make it a display device after this, another interlayer insulating film and a pixel electrode are formed as necessary. Signal lines including the source line 9 and a gate line (not shown) electrically connect with the source/drain region 31 and gate electrode 6 to transmit image signals and control signals from the external circuit and the circuit formed on the substrate.

Figure 2A:
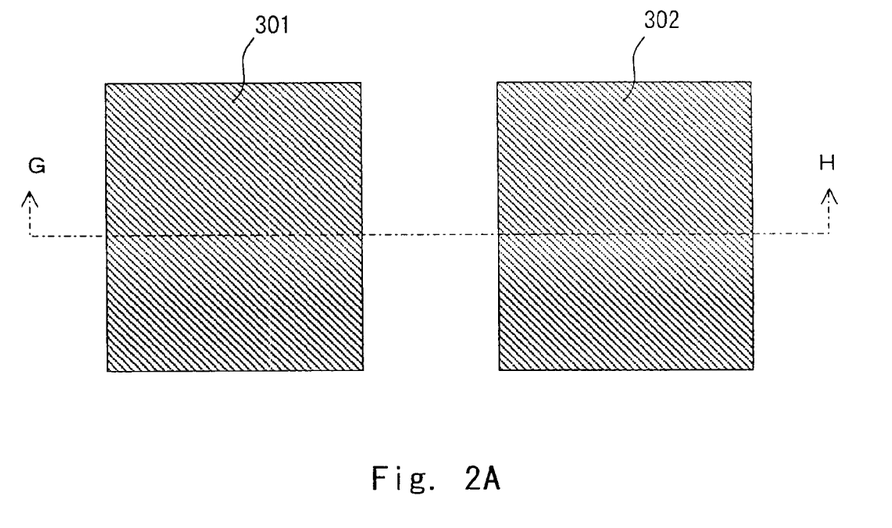
FIG. 2A is a plane view showing a manufacturing process of a TFT according to the present invention.
Figure 2B:
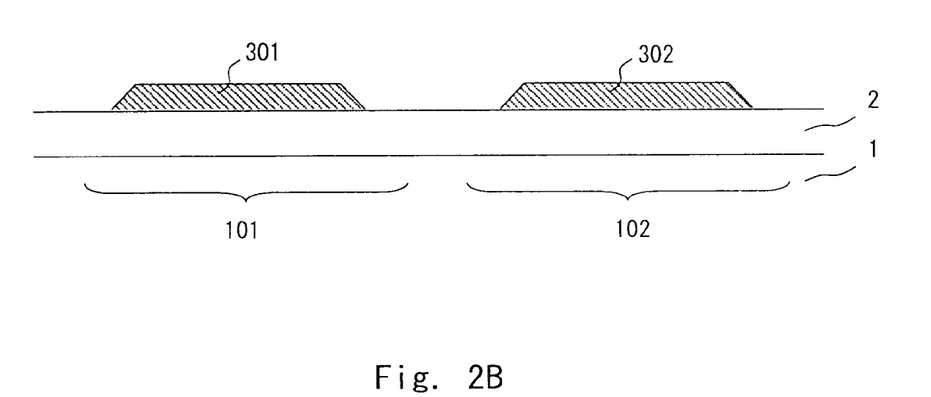
FIG. 2B is a cross-sectional view showing a manufacturing process of the TFT according to the present invention.

A TFT manufacturing process by CMOS process is described hereinafter in detail with reference to FIGS. 2 to 5. FIGS. 2A and 2B illustrates a process in which after depositing the insulating protective layer 2 over the insulating substrate 1, a semiconductor layer 301 of an NMOS region 101 and a semiconductor layer 302 of a PMOS region 102 are formed. FIG. 2A is a plane view, and FIG. 2B is a cross-sectional view at the line G-H in FIG. 2A. In FIGS. 2 to 5, the PMOS region 102 in which a p-channel MOS transistor (PMOS-TFT) is formed is shown on the right side, while the NMOS region 101 in which an n-channel MOS transistor (NMOS-TFT) is formed is shown in the left side.

As shown in FIG. 2B, firstly the insulating substrate 1 such as a glass is cleaned with purified water or acid. Note that the insulating substrate 1 is not limited to glass but may be materials such as quartz and plastic (polycarbonate, acrylic, and so on). Further, even a metallic substrate such as SUS can be used as the substrate material by forming an insulating protective layer thereon.

Then an insulating material is formed on the insulating substrate 1 by CVD (Chemical Vapor Deposition) method or the like to form the insulating protective layer 2. If the insulating protective layer 2 is formed on a conductive substrate, such as a metal substrate, it insulates devices (e.g. TFT) from the substrate. The insulating protective layer 2 also prevents contaminated materials from spreading from the insulating substrate 1. It further has a purpose to suppress an interface state density with the semiconductor layer 3 that is formed above the insulating protective layer 2 to stabilize the performance of TFT. Note that silicon dioxide film, a silicon nitride film, a stacked film of these films or a composite film (oxynitriding film) is used for the insulating protective layer 2.

Next, silicon which is a semiconductor layer is deposited over the insulating protective layer 2. Then following a photolithography, an etching and a resist removing processes, the semiconductor layer is patterned. As FIGS. 2A and 2B illustrate the TFT manufacturing process by CMOS process, the semiconductor layer 301 in the NMOS region 101 and the semiconductor layer 302 in the PMOS region 102 are respectively formed. Other than p-Si film, amorphous silicon film and micro crystal silicon may be used for the material of the semiconductor layers 301 and 302. With a purpose to improve TFT characteristics, a process to crystallize the silicon may be added after depositing the semiconductor layer or patterning the semiconductor layer as appropriate. As an example of the crystallizing process, solid phase growth by laser irradiation or heat treatment can be considered.

A process concerning the formation of the gate electrode 6 to the formation of the source/drain region is described hereinafter in detail with reference to FIGS. 3 and 4. The process is core in the explanation of the characteristics of the TFT according to the present invention. FIGS. 3A and 3B explain a process concerning the formation a gate electrode in the PMOS region 102 to the formation of a source/drain region 312. Similarly to FIGS. 2A and 2B, FIG. 3A is a plane view and FIG. 3B is a cross-sectional view at the line G-H in FIG. 3A. Firstly the gate insulating film 5 is deposited to cover the semiconductor layers 301 and 302 that are formed in FIGS. 2A and 2B. The gate insulating film 5 is made of a silicon dioxide film or the like so as to suppress an interface state density with the semiconductor layers 301 and 302. In light of heat distortion of the material for the insulating substrate 1, the gate insulating film 5 is desirably formed by a low temperature CVD method, however the material and the method for forming the film is not limited to those mentioned above.

Next, a gate electrode layer is deposited on the gate insulating film 5. For the material of the gate electrode 6, metallic materials such as Cr, W, Mo and Al or conductive poly silicon layer may be used. However it is not limited to a single material but may be an alloy or a stacked film of these metals. After a photolithography, an etching and resist removing processes, the gate electrode 6 in the PMOS region 102 is formed. At this time, the opening 61 is created in the portion corresponding to the upper part of the edge in the channel width direction in the NMOS region 101. This can be done by creating the openings 61 in a mask pattern of the gate electrode 6. In this way, the openings 61 can be formed at the same time as the process of forming the gate electrode 6 in the PMOS region 102. After removing the resist (not shown) for forming the gate electrode 6, an impurity doping 21 is performed so as to form the source/drain region 312 in the PMOS region 102. The impurity to be doped is to form the source/drain region 312 in the PMOS region 102, thus it is a p-type impurity such as boron (B). This forms the TFT (PMOS-TFT) in the PMOS region 102. As the openings 61 are created on the gate electrode in the NMOS region 101, the p-type impurity is doped in the edge portion of the channel of the semiconductor layer 301 corresponding to these regions.

As highly concentrated p-type impurity is doped in the channel region corresponding to the opening 61, an inversion layer is difficult to be formed in this region. Consequently the hump in Id-Vg characteristic is suppressed.

As set forth above, one of the characteristics of the first embodiment is that at the same time of the impurity doping 21 into the source/drain region 312 in the PMOS region 102, the same p-type impurity having the same concentration is doped in a tapered portion 41 of the semiconductor layer 301 in the NMOS region 101. The method of impurity doping 21 may either be an ion implantation with mass separation or an ion doping without mass separation. Further in the above explanation, the impurity doping 21 is performed after removing the resist for forming the gate electrode 6, however it may be performed before removing the resist.

Next, a process concerning the formation of the gate electrode in the NMOS region 101 to the formation of a source/drain region 311 is described hereinafter in detail. In FIGS. 4A and 4B as in FIGS. 2A to 3B, FIG. 4A is a plane view and FIG. 4B is a cross-sectional view at the line G-H in FIG. 4A. After forming the TFT in the PMOS region 102 in FIGS. 3A and 3B, the gate electrode 6 in the NMOS region 101 is further patterned following a photolithography and an etching processes in FIGS. 4A and 4B. At this time, an opening 67 is created in the portion corresponding to the upper part of the edge in the channel width direction in the PMOS region 102. This can be done by creating the openings 67 in a mask pattern of the gate electrode 6. In this way, the openings 67 can be formed at the same time as the process of forming the gate electrode 6 in the NMOS region 101. Note that a resist 65 indicated with the dotted line in FIG. 4A has a planar pattern to form the gate electrode 6 in the NMOS region 101 and to form the opening 67 corresponding to the upper part of the edge in the channel width direction in the PMOS region 102.

Next, by patterning the gate electrode 6 with the resist 65 being formed, the gate electrode in the NMOS region is formed and at the same time, the openings 67 on the gate electrode 6 can be formed in the PMOS region 102.

After that, an impurity doping 22 is performed so as to form the source/drain region 311 in the NMOS region 101. The impurity to be doped is to form the source/drain region 311 in the NMOS region 101, thus it is an n-type impurity such as phosphorus (P) or arsenic (As). This forms the TFT (NMOS-TFT) in the NMOS region 101. As the openings 67 are created on the gate electrode 6 in the PMOS region 102, the n-type impurity is doped in the edge portion of the channel of the semiconductor layer 302 corresponding to these regions.

Here, as the source/drain region 312 in the PMOS region 102 and the openings 61 in the NMOS region 101 are covered with the resist 65, the n-type impurity is not doped.

As highly concentrated n-type impurity is doped in the channel region corresponding to the opening 67, an inversion layer is difficult to be formed in this region. Consequently the hump in Id-Vg characteristic is suppressed.

Figure 3A:
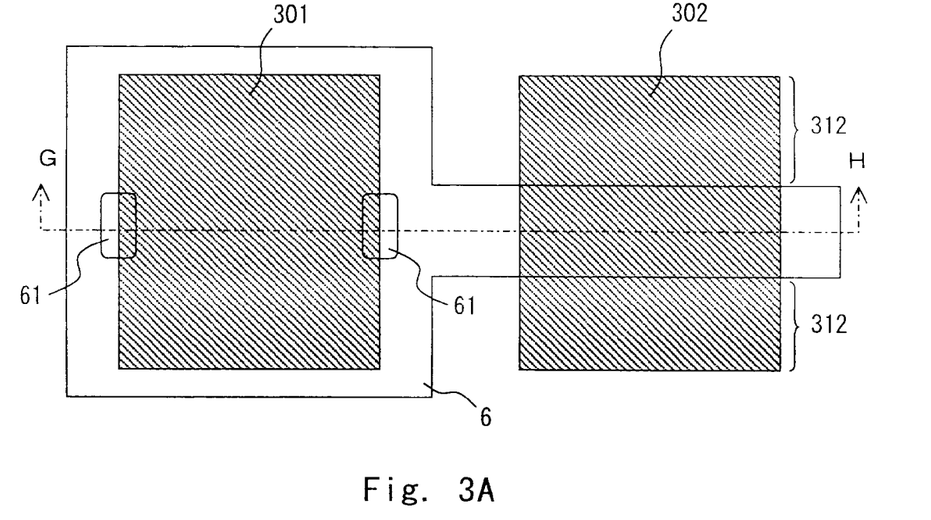
FIG. 3A is a plane view showing a manufacturing process of the TFT according to the present invention.
Figure 3B:
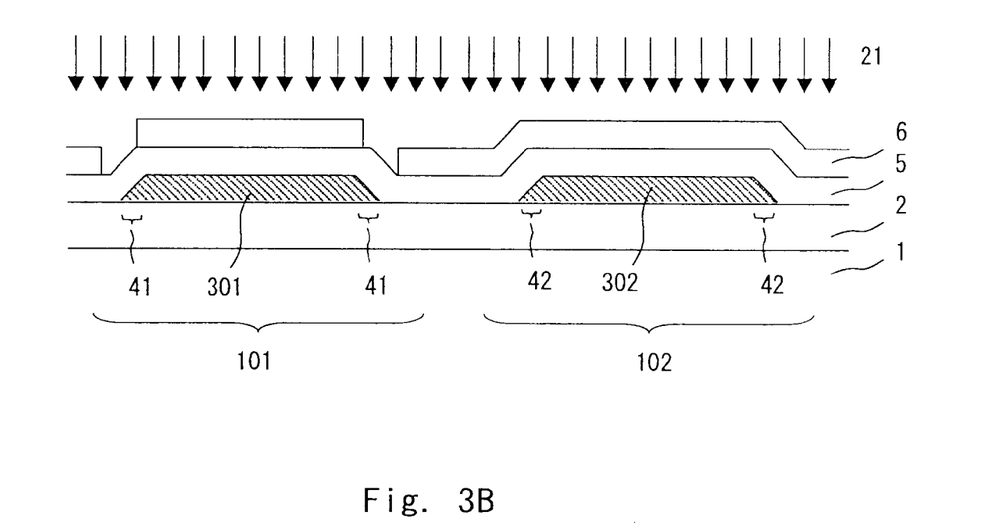
FIG. 3B is a cross-sectional view showing a manufacturing process of the TFT according to the present invention.

As set forth above, one of the characteristics of the first embodiment is that at the same time of the impurity doping 22 into the source/drain region 311 in the NMOS region 101, the same n-type impurity having the same concentration is doped in a tapered portion 42 of the semiconductor layer 302 in the PMOS region 102, as in FIGS. 3A and 3B. The method of impurity doping 22 may either be an ion implantation with mass separation or an ion doping without mass separation.

Figure 4A:
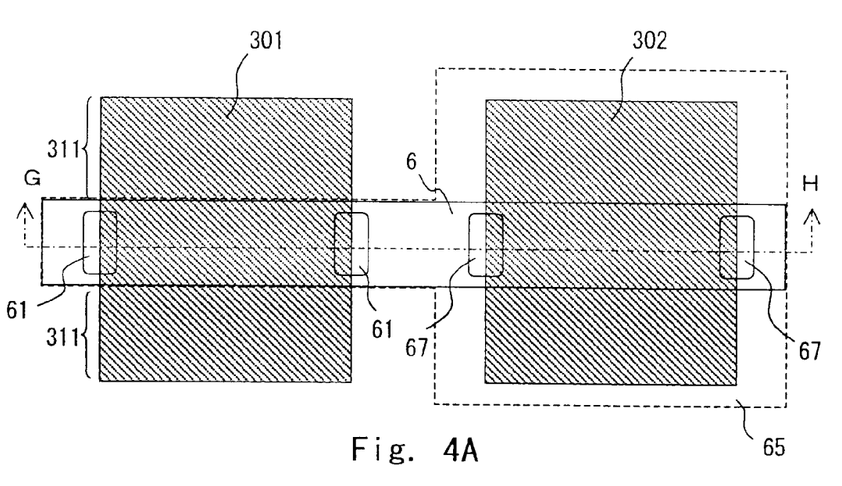
FIG. 4A is a plane view showing a manufacturing process of the TFT according to the present invention.
Figure 4B:
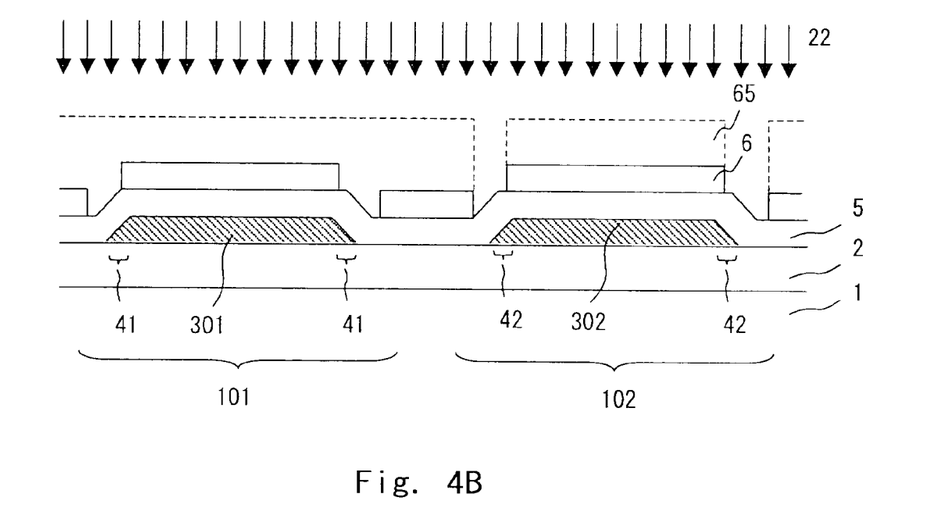
FIG. 4B is a cross-sectional view showing a manufacturing process of the TFT according to the present invention.

However the impurity doping 22 in FIGS. 4A and 4B must be performed before removing the resist 65. This is because that when the impurity doping 22 for the source/drain region 311 in the NMOS region 101 is performed after removing the resist 65, the impurities of both NMOS and PMOS are doped to the source/drain region 312 in the PMOS region 102.

Note that in NMOS-TFT, LDD (Lightly Doped Drain) portion can be formed but it does not concern the nature of the invention. Thus it is not explained in detail here.

As set forth above, by doping the impurity of the same type as the complementary type of the source/drain regions 311 and 312 in the tapered portions 41 and 42 from the opening 61 or 67, the formation of channels in the tapered portions 41 and 42 can be suppressed. Thus the deterioration of Id-Vg characteristic shown in FIG. 11 can be suppressed. The "impurity of the same type as the complementary type of the source/drain region" is the same impurity of the same type as the source/drain region of opposing MOS in a complementary MOS structure. For example when focusing on the NMOS-TFT, it means that the same impurity as the source/drain region 312 in the PMOS region 102 is doped in the opening 61 of the gate electrode 6 in the NMOS region 101. On the other hand when focusing on the PMOS-TFT, it means that the same impurity as the source/drain region 311 in the NMOS region 101 is doped in the opening 67 of the gate electrode 6 in the PMOS region 102.

Figure 5A:
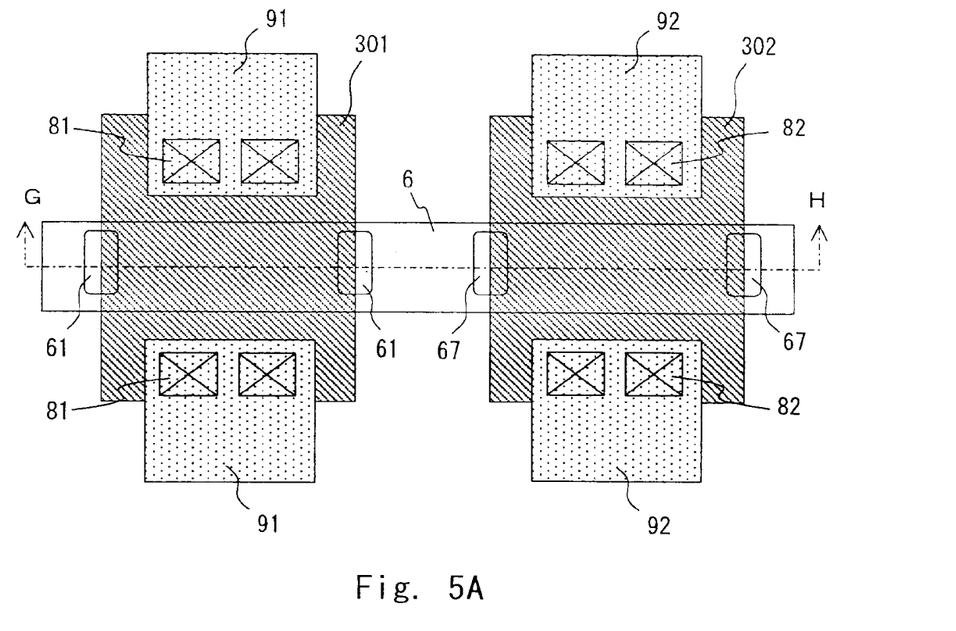
FIG. 5A is a plane view showing a manufacturing process of the TFT according to the present invention.
Figure 5B:
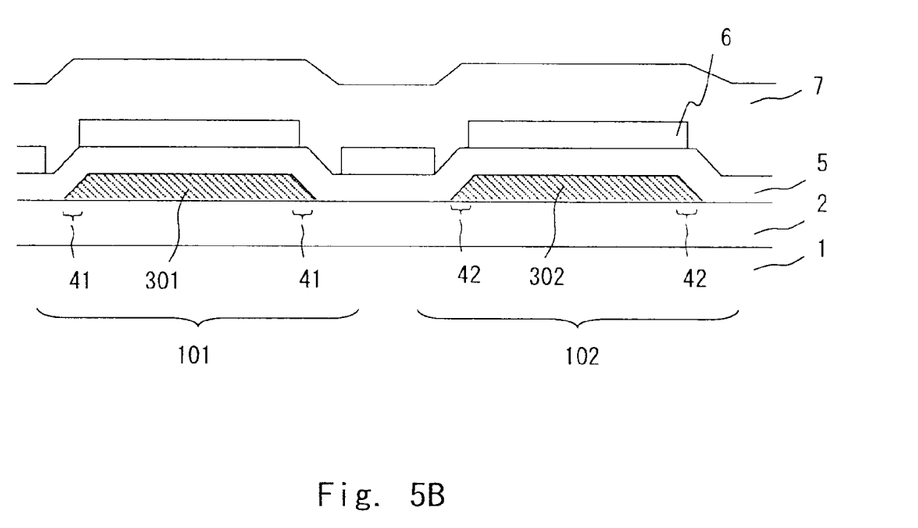
FIG. 5B is a cross-sectional view showing a manufacturing process of the TFT according to the present invention.

Lastly, the formation of the source line 9 is described hereinafter with reference to FIGS. 5A and 5B. In FIGS. 5A and 5B as in FIGS. 2A and 2B, FIG. 5A is a plane view and FIG. 5B is a cross-sectional view at the line G-H in FIG. 5A. After the process shown in FIGS. 4A and 4B, the resist 65 is removed, a cleaning process is performed at an appropriate time and then the interlayer insulating film 7 is deposited. After that, following a photolithography, an etching and a resist removing processes, contact holes 81 and 82 are created. Then following the deposition of line material, a photolithography, an etching and a resist removing processes, source lines 91 and 92 are formed so as to form a desired circuit. Then the formation of the CMOS-TFT is completed.

With the abovementioned configuration, in manufacturing a TFT by CMOS process, hump in subthreshold characteristic (Id-Vg characteristic) can be suppressed without adding a new process. Specifically, by doping the impurity of the same type as the source/drain region of complementary type in the tapered portion of the semiconductor layer in the same process as the process of doping impurity in the source/drain region, the formation of channels can be suppressed in the tapered portion. As set forth above, according to the first embodiment, it is possible to form a TFT having excellent characteristics without changing the process of forming CMOS and also without additional process steps.

With the abovementioned configuration, the impurity of the same type as the source/drain region of the complementary type to the tapered portion of the semiconductor layer is doped with high concentration. Accordingly as in the problem generated in the technique disclosed in Japanese Unexamined Patent Application Publication No. 7-326763, even if a fixed potential exists in the insulating film or the interface of the insulating film near the tapered portion, an inversion layer cannot easily be formed. Thus it is possible to further prevent from deteriorating the subthreshold characteristic.

Second Embodiment

Figure 6:
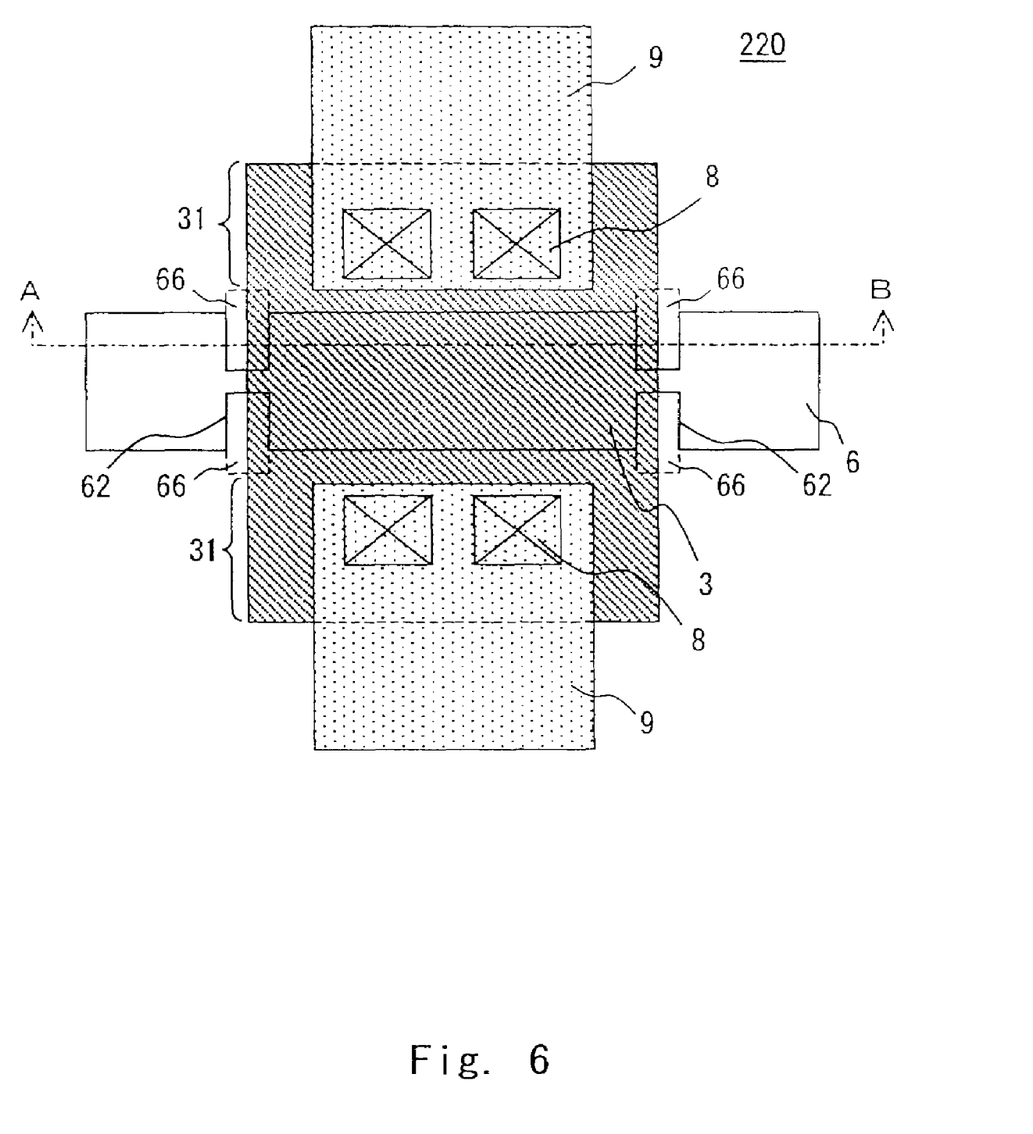
FIG. 6 is a plane view showing a TFT according to a second embodiment of the present invention.

A second embodiment is described hereinafter in detail with reference to FIG. 6. FIG. 6 is a plane view showing a planar structure of a TFT 220 of the second embodiment. In the description that follows, like parts as the first embodiment are indicated with the same reference numerals as in FIGS. 1A to 1C. The second embodiment is characterized by the shape of the opening of the gate electrode 6.

As shown in FIG. 6, an opening 62 of the gate electrode 6 according to the second embodiment is placed in a region corresponding to the upper part of the tapered portion 4 of the semiconductor layer 3. Note that the cross-sectional structure along the line A-B of FIG. 6 is same as FIG. 1B. The opening 62 has almost same width as the tapered portion 4, with a rectangular shape along with the channel length direction. The shape of the opening 62 is not limited to a rectangle but may be an oval shape. The gate electrode 6 above the tapered portion 4 is not completely separated on the tapered portion 4 but is connected by at least a part of the center to the channel length direction with both edges opening in a rectangle shape.

The pattern of the gate electrode 6 can be realized by changing the patterns on the mask at a time of patterning. Accordingly the manufacturing method for the second embodiment is identical to the method for the first embodiment. Thus the explanation will not be repeated here. In the second embodiment, an impurity of the complementary type to the source/drain region 31 is doped from the opening 62 to the tapered portion 4 of the semiconductor layer 3 of the TFT 220. As a result, it is possible to form a region 66 in which an impurity of the opposite type to the source/drain 31 of the TFT 220 is doped.

With this configuration, the second embodiment is able to achieve identical effects as the first embodiment.

Third Embodiment

Figure 7:
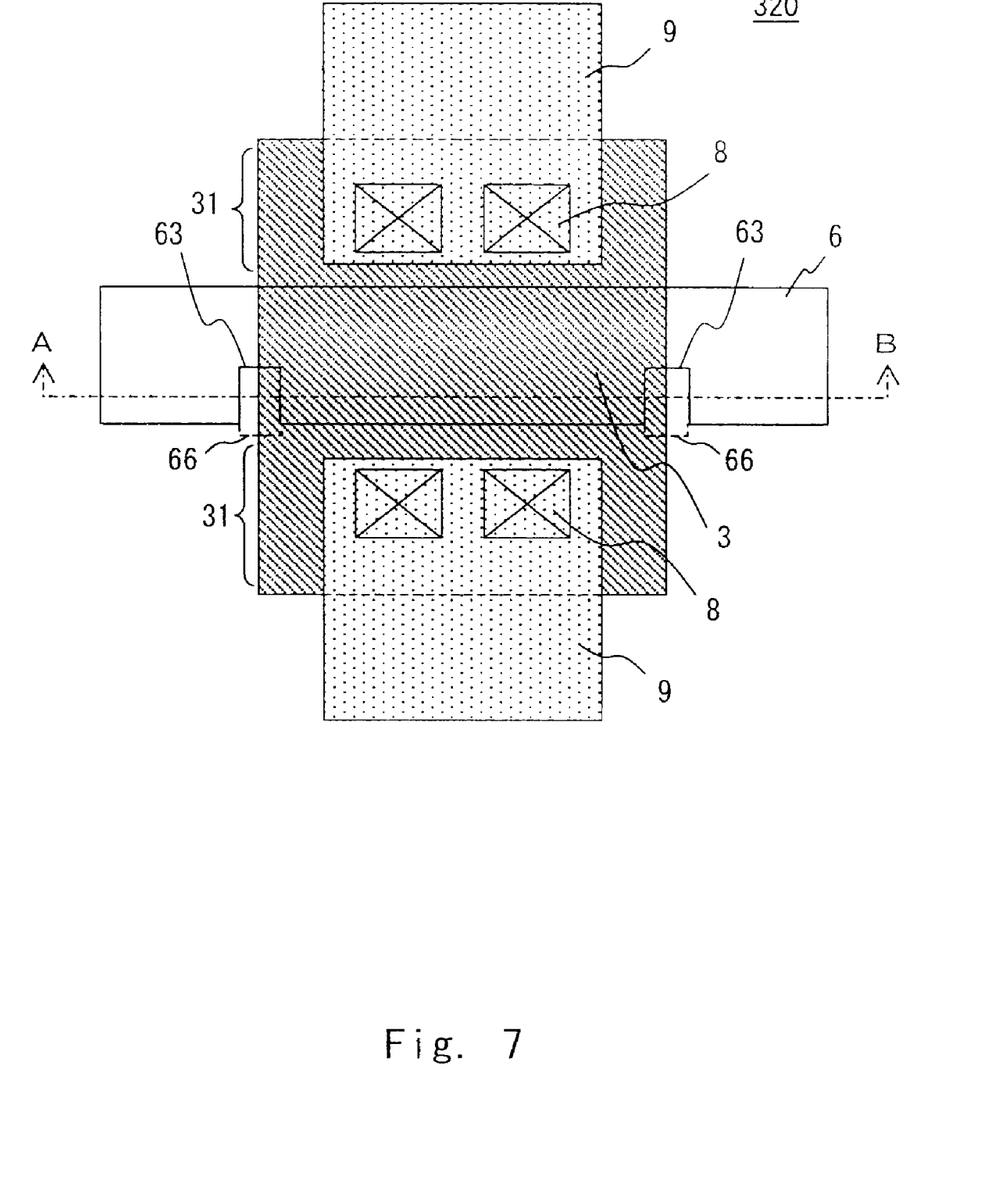
FIG. 7 is a plane view showing a TFT according to a third embodiment of the present invention.

A third embodiment is described hereinafter in detail with reference to FIG. 7. FIG. 7 is a plane view showing a planar structure of a TFT 320 according to the third embodiment. In the description that follows, like parts as the first embodiment are indicated with the same reference numerals as in FIGS. 1A to 1C. As with the second embodiment, the third embodiment is characterized by the shape of the opening of the gate electrode 6.

As shown in FIG. 7, an opening 63 of the gate electrode 6 according to the third embodiment is placed in a region corresponding to the upper part of the tapered portion 4 of the semiconductor layer 3. Note that the cross-sectional structure along the line A-B in FIG. 7 is same as FIG. 1B. The opening 63 has almost same width as the tapered portion 4, with a rectangular shape along with the channel length direction. The shape of the opening 63 is not limited to a rectangle but may be an oval shape. The gate electrode 6 in the upper part of the tapered portion 4 is not completely separated on the tapered portion 4, but is connected by up to almost half to the channel length direction with one edge opening in a rectangle shape. The direction to be opened may either be the source side or drain side direction.

The pattern of the gate electrode 6 can be realized by changing the patterns on the mask at a time of patterning. Accordingly the manufacturing method for the third embodiment is identical to the method for the first embodiment. Thus the explanation will not be repeated here. In the third embodiment, an impurity of the complementary type to the source/drain region 31 is doped from the opening 63 to the tapered portion 4 of the semiconductor layer 3 of the TFT 320. As a result, it is possible to form a region 66 in which an impurity of the opposite type to the source/drain 31 of the TFT 320 is doped.

With this configuration, the third embodiment is able to achieve identical effects as the first embodiment.

Fourth Embodiment

Figure 8A:
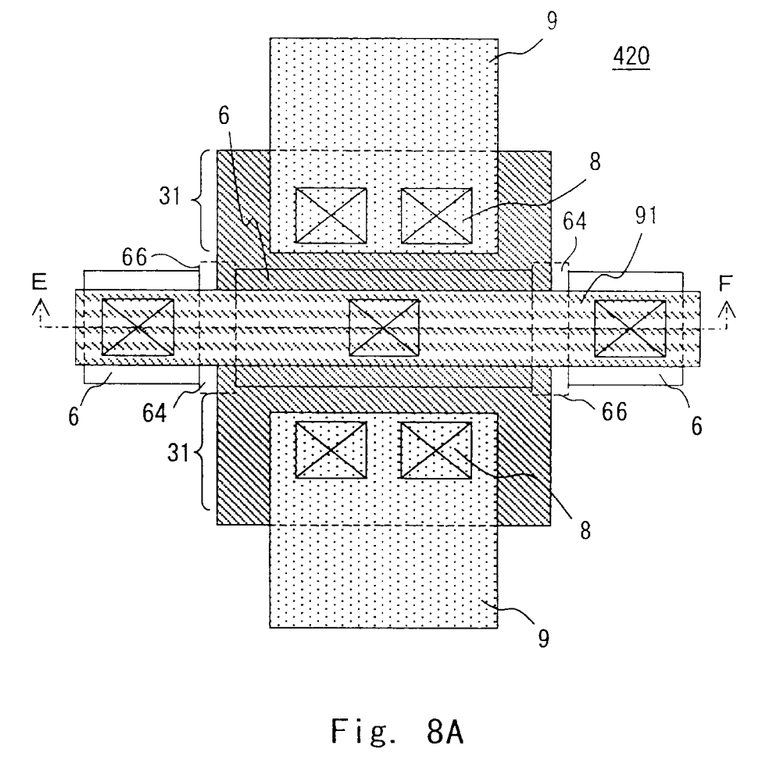
FIG. 8A is a plane view showing a TFT according to a fourth embodiment of the present invention.
Figure 8B:
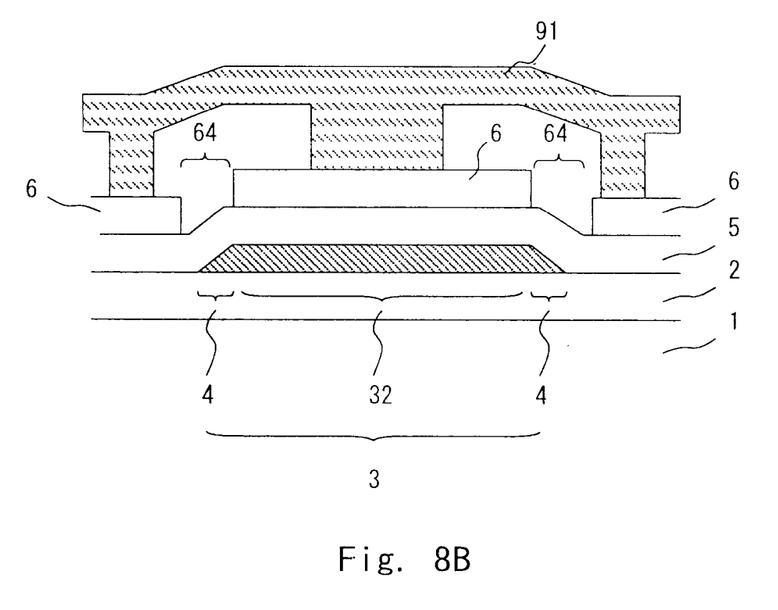
FIG. 8B is a cross-sectional view showing the TFT according to the fourth embodiment of the present invention.

A fourth embodiment is described hereinafter in detail with reference to FIGS. 8A and 8B. FIG. 8A is a plane view showing a planar structure of a TFT 420 of the fourth embodiment. FIG. 8B is a cross-sectional view at the line E-F of FIG. 8A. In the description that follows, like parts as the first embodiment are indicated with the same reference numerals as in FIGS. 1A to 1C. As with the second and third embodiments, the fourth embodiment is characterized by the shape of the opening of the gate electrode 6.

As shown in FIG. 8A, an opening 64 of the gate electrode 6 according to the fourth embodiment is placed in a region corresponding to the upper part of the tapered portion 4 of the semiconductor layer 3. FIG. 8B shows a cross-sectional structure at the line E-F. The opening 64 has almost the same width as the tapered portion 4, opening towards the channel length direction of the gate electrode 6. That is, the gate electrode 6 above the tapered portion 4 is completely separated on the tapered portion 4. Thus the gate electrode 6 that exists on the gate insulating film 5 over the channel region 32 is separated from the portion excluding the tapered portion 4. Accordingly as shown in FIG. 8B, the separated gate electrode 6 must be connected with a conductive layer such as the one same as the source line 91, which is formed in the following process.

The pattern of the gate electrode 6 can be realized by changing the mask shape at a time of patterning. Accordingly the manufacturing method for the fourth embodiment is identical to the method for the first embodiment. Thus the explanation will not be repeated here. In the fourth embodiment, an impurity of the complementary type to the source/drain region is doped from the opening 64 to the tapered portion 4 of the semiconductor layer 3 of the TFT 420. As a result, it is possible to form a region 66 in which an impurity of the opposite type to the source/drain of the TFT 420 is doped.

With this configuration, the fourth embodiment is able to achieve identical effects as the first embodiment.

The present invention is not limited to the abovementioned embodiments. Those skilled in the art will recognize that many alternative embodiments can be accomplished using the teachings of the present invention and that the invention is not limited to the embodiments illustrated for explanatory purposes. For example in the manufacturing process of the TFT by CMOS process, the order of process for forming the NMOS and PMOS regions can be opposite. Although the thin film transistor of the present invention is described using the thin film transistor formed in the scanning signal circuit 115 or display signal circuit 116, it is not limited to this. For example the present invention may be applied to a thin film transistor in a pixel as long as CMOS is formed in the array substrate 110.

The display device of this embodiment is explained with an example of a liquid crystal display but it is illustrative only and a flat panel display including an organic EL display device may be used.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor substrate comprising:
   a thin film transistor of a first channel conductivity type; and
   a thin film transistor of a second channel conductivity type,
   wherein in the thin film transistors, an opening is provided in a gate electrode opposed to a channel region with a gate insulating film interposed therebetween,
   the opening is formed in at least a part of the gate electrode over a tapered portion in an edge of the channel region,
   an impurity region of a same type as a source/drain region of the thin film transistor of the second channel conductivity type is formed in a channel region corresponding to the opening in the thin film transistor of the first channel type, and
   an impurity region of a same type as a source/drain region of the thin film transistor of the first channel conductivity type is formed in a channel region corresponding to the opening in the thin film transistor of the second channel type.

2. The thin film transistor substrate according to claim 1, wherein the opening is opened to a source region side or a drain region side of the thin film transistors.

3. The thin film transistor substrate according to claim 1, wherein the opening is opened from the source region side to the drain region side of the thin film transistor in a planar manner.

4. The thin film transistor substrate according to claim 3, wherein the gate electrode opposed to the channel region with the gate insulating film interposed therebetween is electrically connected by a wiring layer formed in an upper layer than the gate electrode.

5. A method for manufacturing a thin film transistor substrate comprising a thin film transistor of a first channel conductivity type and a thin film transistor of a second channel conductivity type, the method comprising:
   performing an impurity doping for forming a source/drain region in the thin film transistor of the first channel conductivity type in a same process as an impurity doping for a channel region corresponding to an opening provided in the gate electrode of the thin film transistor of the second channel conductivity type; and
   performing an impurity doping for forming a source/drain region in the thin film transistor of the second channel conductivity type in a same process as an impurity doping for a channel region corresponding to an opening provided in the gate electrode of the thin film transistor of the first channel conductivity type.

* * * * *